(12) United States Patent
Chen et al.

(10) Patent No.: US 7,218,522 B2
(45) Date of Patent: May 15, 2007

(54) HEAT DISSIPATING DEVICE

(75) Inventors: Chun-Chi Chen, Tu-Cheng (TW);
Shi-Wen Zhou, Shenzhen (CN); Meng Fu, Shenzhen (CN); Chi Liang, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

(*) Notice: Subject to any disclaimer, the term of this patent is extended or adjusted under 35 U.S.C. 154(b) by 151 days.

(21) Appl. No.: 11/135,575

(22) Filed: May 23, 2005

(65) Prior Publication Data

US 2006/0018096 A1    Jan. 26, 2006

(30) Foreign Application Priority Data

Jul. 22, 2004  (CN)  .................. 2004 1 0050828

(51) Int. Cl.
*H05K 7/20* (2006.01)

(52) U.S. Cl. .................. 361/704; 361/703; 361/709; 361/710; 257/706; 257/722; 165/80.3

(58) Field of Classification Search ........ 361/702–704, 361/707–711, 714–719; 257/706–712, 715–727; 165/80.3, 185; 174/16.3
See application file for complete search history.

(56) References Cited

U.S. PATENT DOCUMENTS 4,009,752 A    3/1977   Wilson

FOREIGN PATENT DOCUMENTS

| CN | ZL 01274977.X | 10/2002 |
| CN | ZL 03263204.5 | 11/2004 |
| JP | 402243356 A * | 9/1990 |
| JP | 2002190683 A * | 7/2002 |
| JP | 2004084488 A * | 3/2004 |
| TW | 433255 | 5/2001 |
| TW | 5269618 | 4/2003 |
| TW | M245501 | 10/2004 |

* cited by examiner

*Primary Examiner*—Michael Datskovskiy
(74) *Attorney, Agent, or Firm*—Morris Manning & Martin LLP; Tim Tingkang Xia, Esq.

(57) ABSTRACT

A heat dissipating device includes a heat sink and a protecting device attached to the heat sink. The heat sink includes a plurality of individual fins in assembly. The protecting device is made from plastic. The protecting device includes a lath resting on the fins, and a plurality of ribs beneath the lath. The ribs are interposed between the fins.

17 Claims, 5 Drawing Sheets

HEAT DISSIPATING DEVICE

BACKGROUND

1. Field

The present invention relates generally to heat dissipating devices, and more particularly to a heat dissipating device used for electronic components.

2. Prior Art

With advancement of computer technology, electronic components operate rapidly. It is well known that the more rapidly the electronic components operate, the more heat the electronic components generate. If the heat is not dissipated duly, the stability of the operation of the electronic components will be impacted severely. Generally, in order to ensure the electronic components run normally, a heat dissipating device is desired to dissipate the heat generated by the electronic components.

Conventionally, owing to low cost of mould and low level requirement of technics, heat dissipating devices comprising aluminum extruding heat sinks or die casting heat sinks are used widely to remove heat generated by the electronic components. However, due to tehchnics of manufacturing these heat sinks, fins of the heat sinks are formed integratively, such that they are thick and cannot be made thin adequately. Accordingly, the amount of fins of the heat sink decreases, i.e., the heat dissipating area is small. While, the heat generated by the electronic component is more and more with advancement of function and frequency of the electronic component. As a result, these heat sinks cannot meet with the heat dissipating demand of the electronic component. Moreover, also due to tehchnics of manufacture, wastage of heat conductive material used for manufacturing the heat sink is raised.

To overcome the problem set out above, an advanced heat sink with a plurality of fins in assembly arises, each fins is stamped from a thin metal sheet. As a result, the heat sink can have larger amount of fins than before. Consequently, the heat dissipating area of the heat sink is enlarged to a great extent. However, on account of the fins being thin, they are prone to be deformed or scrape operators during transportation or assembling.

Accordingly, in order to avoid what foregoing, a new heat sink with a protecting hood is applied. Referring to FIG. 5, a heat sink 1 with a metal protecting hood 3 shaped "☐" is illustrated. The heat sink 1 comprises a plurality of fins 2 stamped from thin metal sheets. The hood 3 hoods on the heat sink 1 and shelters the fins 2 therein to avoid the fins 2 baring to operators or other things. However, the heat sink 1 and the hood 3 are assembled via fasteners 4. It is inconvenient to assemble the hood 3 to the heat sink 1. Moreover, the hood 3 is made form metal, such that a cost of the hood 3 is high.

SUMMARY

Accordingly, what is needed is to provide a heat sink with a protecting device attached the heat sink expediently.

what is needed is to provide a heat sink with a protecting device having a low cost.

A heat dissipating device of a preferred embodiment comprises a heat sink and a protecting device attached to the heat sink. The heat sink comprises a plurality of individual fins in assembly. The protecting device is made from plastic. The protecting device comprises a lath resting on the fins, and a plurality of ribs beneath the lath. The ribs are interposed between the fins.

Other advantages and novel features of the invention will become more apparent from the following detailed description when taken in conjunction with the accompanying drawings, in which:

DETAILED DESCRIPTION OF THE EMBODIMENT

Figure 1:
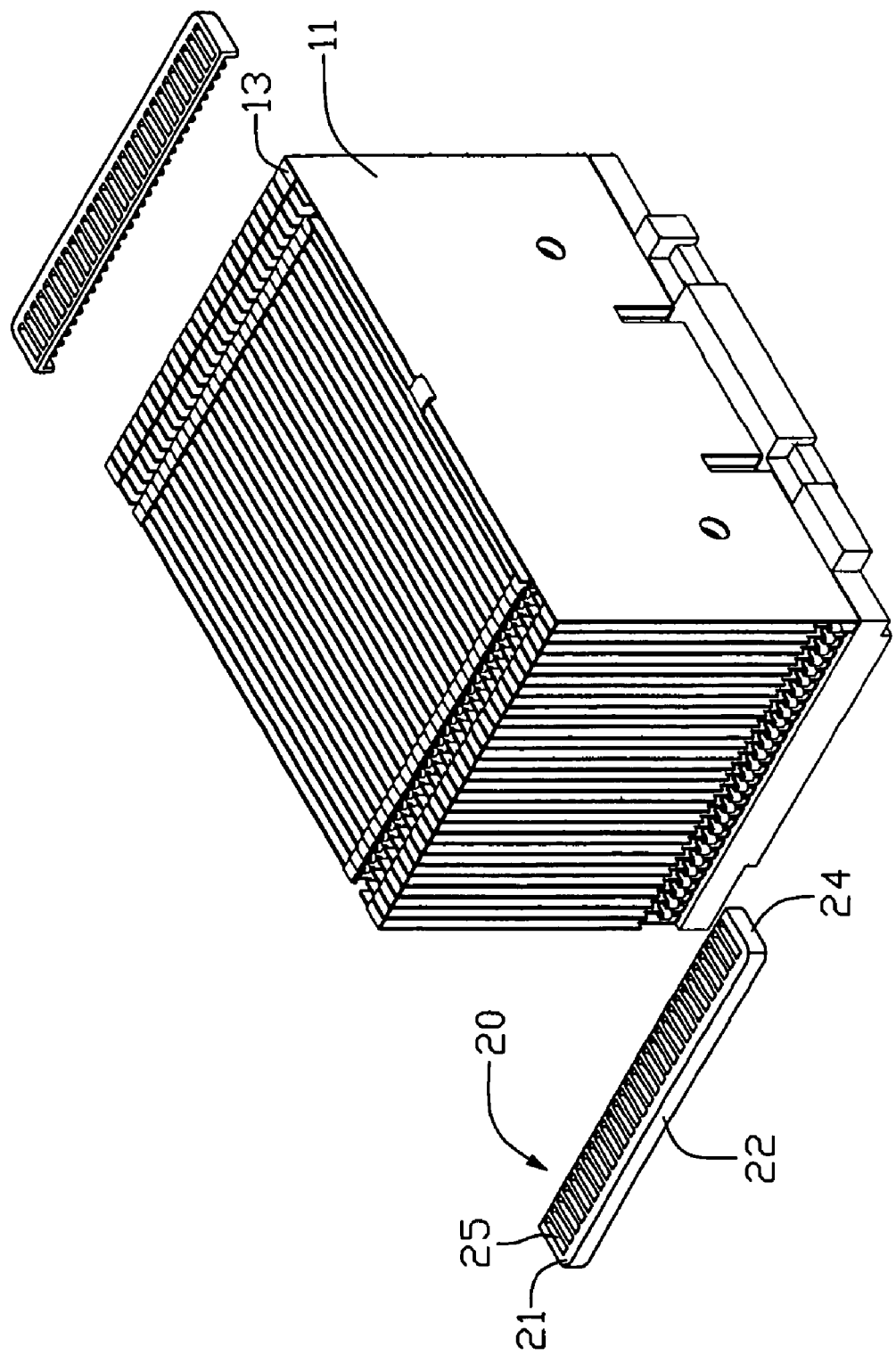
FIG. 1 is an exploded view of a heat sink with protecting devices according to a preferred embodiment of the present invention.
Figure 2:
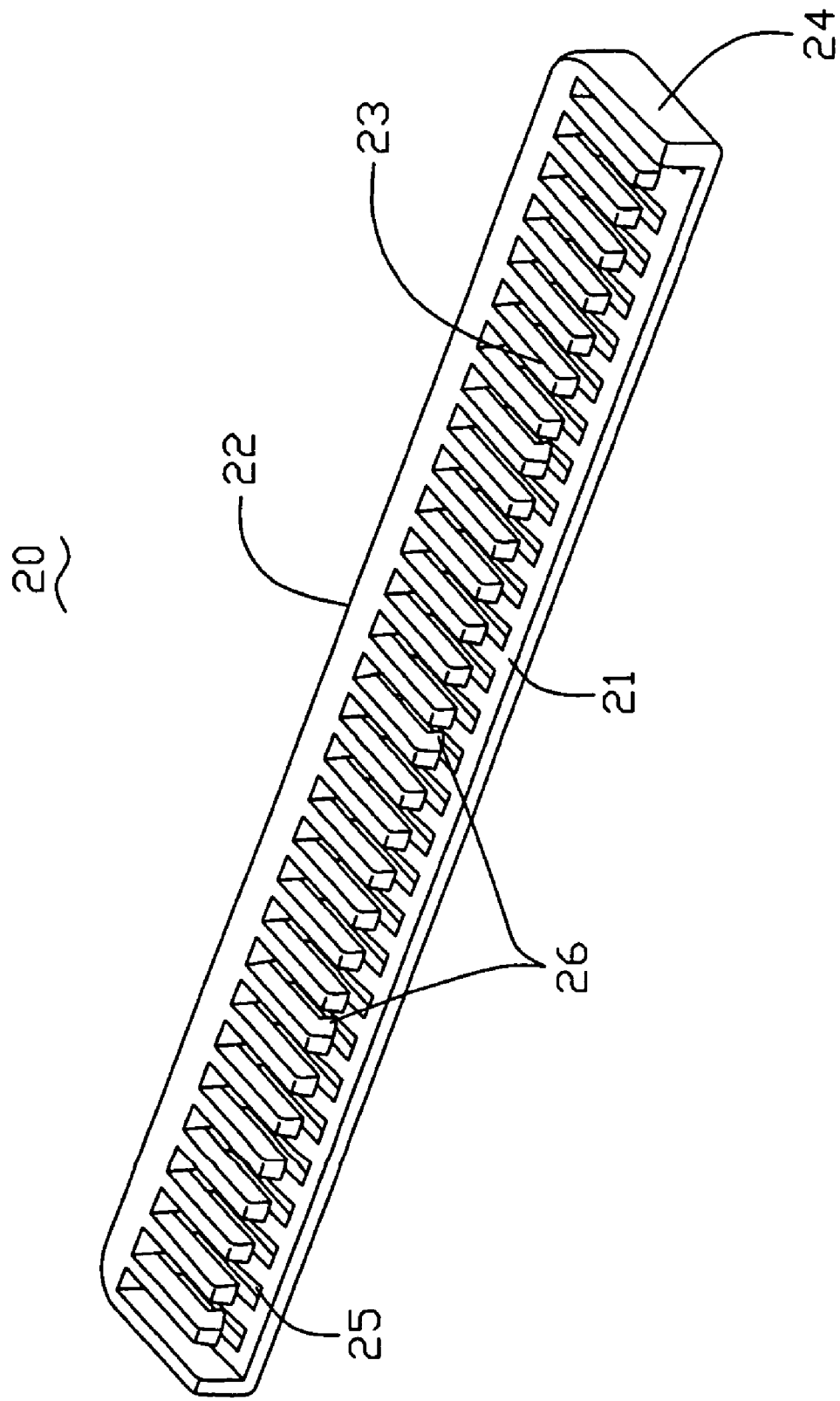
FIG. 2 is an isometric view of a protecting hood of the protecting device of FIG. 1.
Figure 3:
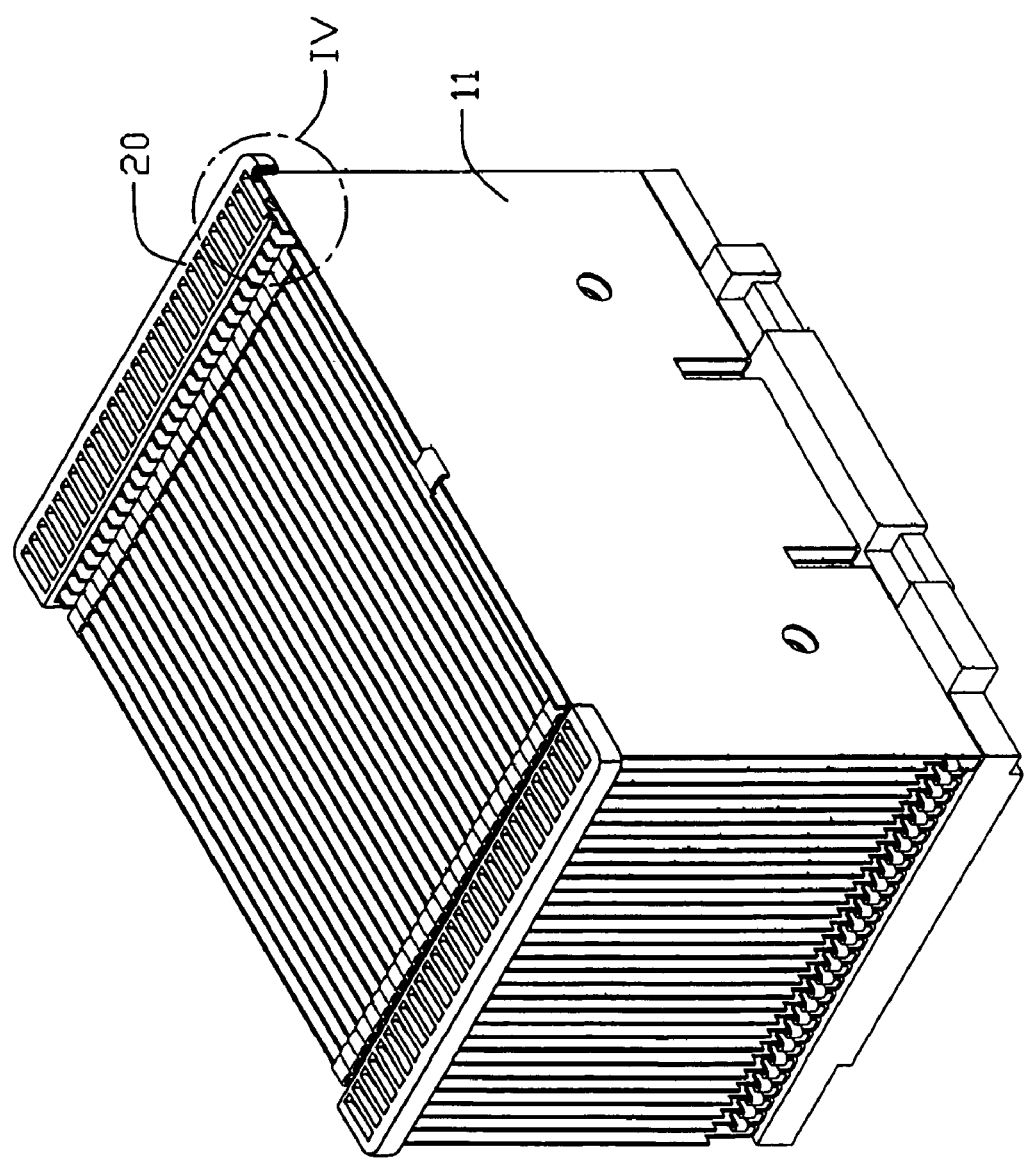
FIG. 3 is an assembly of FIG. 1 with partly cutaway.
Figure 4:
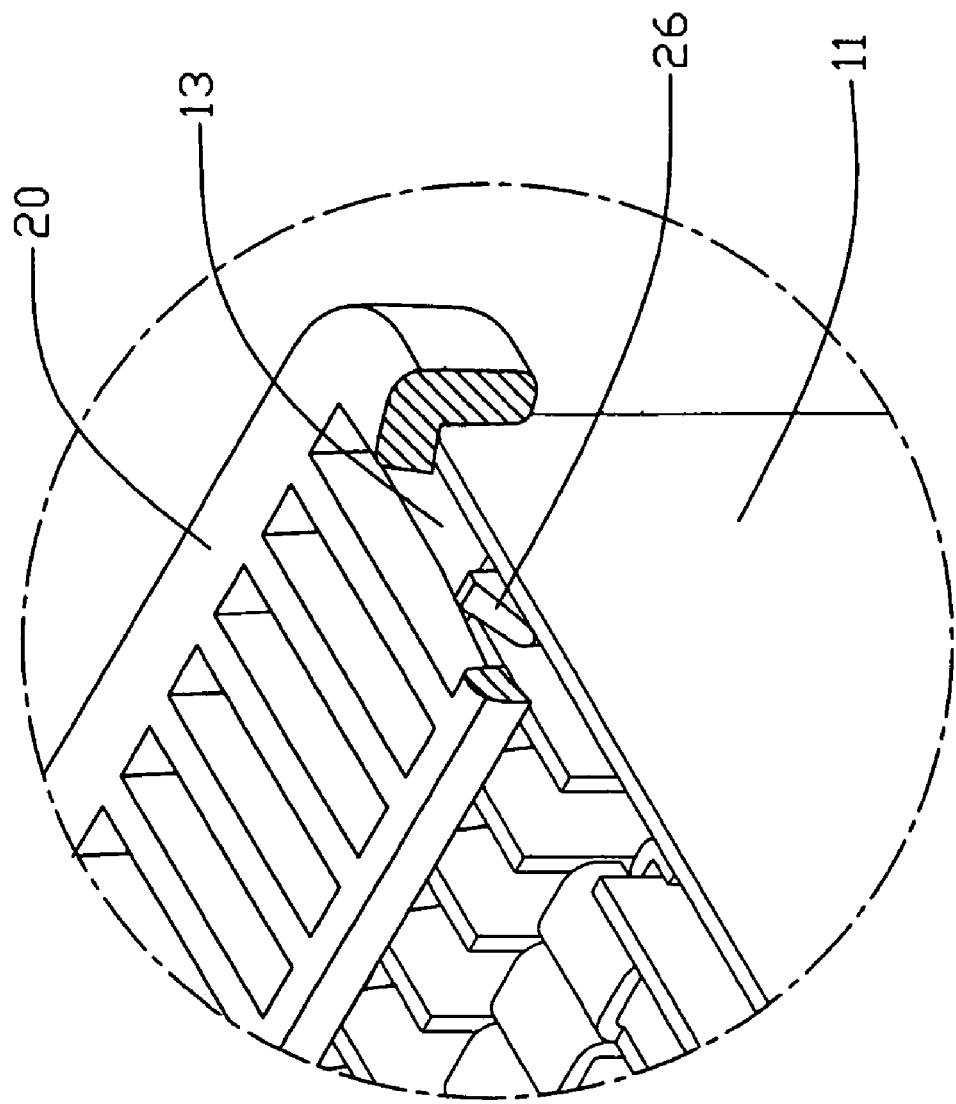
FIG. 4 is a partial enlarged view of part IV of FIG. 3.
Figure 5:
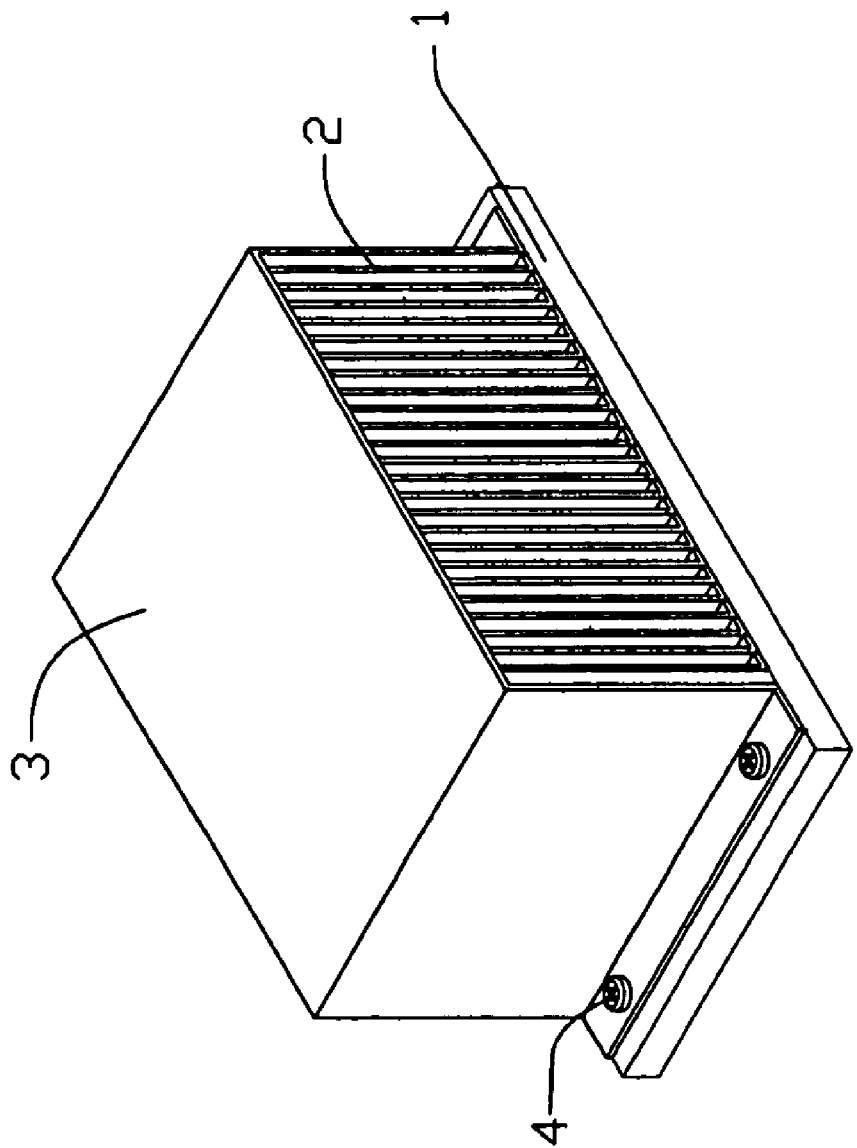
FIG. 5 is a heat sink with a protecting device according to a conventional invention.

Referring to FIGS. 1–3, a heat sink 10 with protecting devices for dissipating heat of a heat source like an electronic component is illustrated. The protecting device comprises two protecting hoods 20. Understandably, the amount of the protecting hoods 20 in use can be varied according to factual demand in application.

The heat sink 10 comprises a base (not labeled) and a plurality of individual fins 11 in assembly. Each fin 11 is stamped from a thin metal sheet. Each fin 11 comprises an upright body (not labeled), and two short flanges 13 formed respectively at two ends of a top edge of the body and perpendicular to the body. For two adjacent fins 11, the flanges 13 of the latter one abut against the body of the former one so as to form an airflow channel (not labeled) between the two adjacent fins.

The protecting hoods 20 are made from plastic. Each protecting hood 20 comprises a lath 21, a first baffle 22 depending from a long side edge of the lath 21, and two second baffles 24 depending from two short side edges of the lath 21 and adjoining the first baffle 22. The lath 21 defines a plurality of parallel through slots 25 in a top surface thereof, which lightens a weight of the protecting hood 20. The first baffle 22 horizontally extends a plurality of parallel ribs 23 from an inner sidewall thereof. The ribs 23 are parallel to the lath 21. Width of each rib 23 is substantially equal to that defined between two adjacent fins 11, so that ribs 23 can be inserted between the adjacent fins 11. At least one rib 23 forms a barb 26 extending toward the lath 21, at a free end thereof, for hooking an inner edge of the flange 13, to secure the protecting hood 20 on the heat sink 10 firmly.

Referring also to FIGS. 1–4, in assembly, the two protecting hoods 20 are attached two opposite ends of the assembled fins 11. The ribs 23 of each protecting hood 20 are interposed between the adjacent fins 11, and the barb 26 hooks the inner edge of the flange 13. Here, the lath 21 is rested on top of the assembled fins 11. The first baffle 22 abuts against outer end of the assembled fins 11. The second baffles 24 abut against the bodies of the outmost fins 11.

It is to be understood, the flanges 13 of the fins 11 can be omitted, and the barb 26 can be omitted correspondingly.

According to the preferred embodiment of the present invention, the protecting hood 20 is attached to the fins 11, such that parts prone to be touched of the fins 11 are sheltered by the baffles 22, 24 and the lath 21. Accordingly, it is avoided to deform the heat sink, and it is safe for operators to operate, during the transportation or assembly of the heat sink. It can be easy to assemble the protecting hood 20 to the heat sink 10 due to the existence of the ribs 23 which are interposed between the adjacent fins 11. Additionally, the protecting hood 20 is made from plastic, such that it is lighter and lower cost compared with the metal protecting hood of the prior arts.

It is to be understood, however, that even though numerous characteristics and advantages of the present invention have been set forth in the foregoing description, together with details of the structure and function of the embodiment, the disclosure is illustrative only, and changes may be made in detail, especially in matters of shape, size, and arrangement of parts within the principles of the invention to the full extent indicated by the broad general meaning of the terms in which the appended claims are expressed.

We claim:

1. A heat dissipating device comprising:
   a heat sink, comprising a plurality of individual fins in assembly; and
   a protecting device attached to the fins, the protecting device comprising a lath resting on the fins and a plurality of ribs beneath the lath and interposed between the fins;
   wherein each of the fins comprises an upright body and a flange formed perpendicular from an edge of the body, and wherein at least one of the ribs forms a barb extending toward the lath, at a free end thereof, the barb of the at least one of the ribs hooking an inner side edge of the flange.

2. The heat dissipating device of claim 1, wherein the protecting device is made from plastic.

3. The heat dissipating device of claim 1, wherein the protecting device is attached to an outmost end of the fins.

4. The heat dissipating device of claim 1, wherein the protecting device further comprises a first baffle depending from the lath and abutting against the fins.

5. The heat dissipating device of claim 4, wherein the ribs extend from an inner sidewall of the first baffle and are parallel to the lath.

6. The heat dissipating device of claim 4, wherein the protecting device comprises at least one second baffle depending from the lath and adjoining the first baffle.

7. The heat dissipating device of claim 6, wherein the at least one second baffle abuts against an outmost fin of the heat sink.

8. The heat dissipating device of claim 1, wherein the lath defines a plurality of slots therein.

9. A protecting device adapted for protecting fins of a heat sink, the protecting device comprising:
   a lath;
   a first baffle depending from the lath; and
   a plurality of spaced ribs extending from the first baffle beneath the lath;
   wherein at least one of the ribs forms a barb extending toward the lath, at a free end thereof.

10. The protecting device of claim 9, wherein the ribs are parallel to the lath.

11. The protecting device of claim 9, wherein the protecting device further comprises at least one second baffle depending from the lath and adjoining the first baffle.

12. The protecting device of claim 9, wherein the lath defines a plurality of through slots therein.

13. A heat dissipating device comprising:
    a base for thermally contacting with a heat source and gain heat therefrom;
    a plurality of heat dissipating fins thermally contacting with said base to gain said heat therefrom and arranged side by side so as to form an airflow-passing channel between every two of said plurality of fins for transmitting said heat to airflow; and
    at least one protecting device disposed beside said plurality of fins and spaced from said base so as to position each of said plurality of fins and maintain a predetermined shape of said channel away from said base;
    wherein the protecting device has a lath, a first baffle extending downwardly from the lath, a plurality of ribs each extending from the first baffle and into a corresponding channel, at least one of the ribs forming a barb extending toward the lath, at a free end thereof.

14. The heat dissipating device of claim 13, wherein said at least one protecting device is made of plastic.

15. The heat dissipating device of claim 13, wherein each of said plurality of ribs is extendable between said every two of said plurality of fins so as to maintain said predetermined shape of said channel.

16. The heat dissipating device of claim 13, wherein said at least one protecting device comprises at least one baffle extending vertically away from said at least one protecting device so as to abut against said plurality of fins outside said channel.

17. The heat dissipating device of claim 13, wherein said at least one protecting device comprises at least one through slot so as to reduce a total weight of said at least one protecting device.

* * * * *